United States Patent [19]

Antilozi

[11] Patent Number: 4,825,199
[45] Date of Patent: Apr. 25, 1989

[54] CIRCUIT UNDERLOADING MONITORING SYSTEM

[76] Inventor: John E. Antilozi, 1153 Chickasaw Cir., Warrington, Pa. 18976

[21] Appl. No.: 921,413

[22] Filed: Oct. 22, 1986

[51] Int. Cl.$^4$ .............................................. G08B 17/10
[52] U.S. Cl. ................................... 340/640; 340/655; 340/664; 219/453; 219/506
[58] Field of Search ............... 340/635, 640, 654, 655, 340/664; 219/487, 250, 536, 506

[56] References Cited

U.S. PATENT DOCUMENTS 3,744,046  7/1973  Tamasi ................................. 340/640
4,496,940  1/1985  Christel, Jr. ......................... 340/640

Primary Examiner—Joseph A. Orsino
Assistant Examiner—Jeffery A. Hofsass
Attorney, Agent, or Firm—Joseph W. Molkasy & Assocs.

[57] ABSTRACT

An improved system for the detection of underloading in an electrical heating circuit where monitoring is available in proximate and remote locations. Circuit monitoring is augmented by control devices which activate alarms in visual or audible form when circuit underloading occurs. This invention has particular application in the plastics molding industry where the control of heat levels within defined ranges must be carefully monitored to ensure process efficacy.

10 Claims, 1 Drawing Sheet

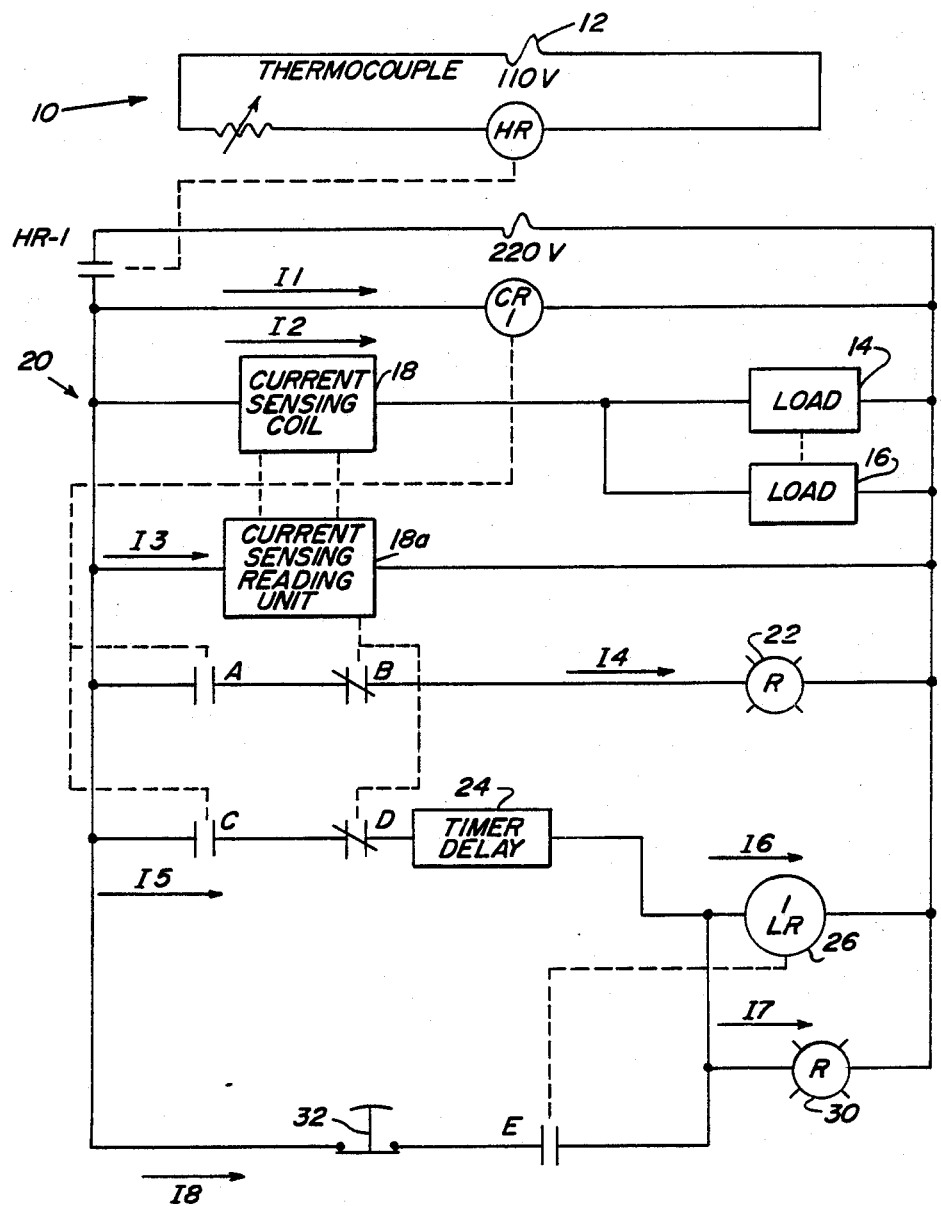

CIRCUIT UNDERLOADING MONITORING SYSTEM

BACKGROUND OF THE INVENTION

1. FIELD OF THE INVENTION

This invention relates to a monitoring system and, more particularly, to the monitoring of an electrical load to detect current fluctuations within proscribed levels.

2. DESCRIPTION OF THE PRIOR ART

It is customary to utilize conventional analog devices such as ammeters to monitor electrical underloading particularly in the plastic molding industry where the underloading of electrical zone heaters in compression and injection presses must be carefully controlled. In such systems it is common to employ one ammeter per zone when operating a compression press having a two zone heater circuit, whereas, several ammeters may be used to monitor an injection molding press having a four zone circuit. Each zone incorporates a plurality of heaters.

Unfortunately, the use of an ammeter to monitor current in a heater is not desirable because the operator is required to observe a needle on a scaled background over an extended period and this creates in the viewer a mindset which dulls operator awareness. The routine is such that operating personnel have difficulty in detecting incremental fluctuations so that over a period of time a gradual and unobservable shift may occur which puts the molding operation in jeopardy.

In plastic molding operations the failure of a zone heater is particularly critical because the ability of thermoplastic resins to plasticize and cure depend upon a carefully controlled system in which temperature variations are avoided.

The present invention avoids such occurrences by providing means for detecting wide fluctuations in temperature and rectifying heater malfunctions with dispatch so that the presses can be restored to a useful and profitable condition with a minimum of down-time.

SUMMARY OF THE INVENTION

The present invention replaces analog monitoring devices with a binary system and it includes an ON-OFF alert apparatus which signals maintenance operators of circuit underloading in proximate as well as remote locations.

The system has particular application in circuits which employ an electrical zone heater of the type used in mold presses where a temperature controller signals a periodic demand for heat. The heaters are used to control the curing or plasticizing of thermoset resins within the mold so that in the event of a malfunction as, for example, when full current is not being supplied to an electrical zone heater load, the proximately located binary switch in the vicinity of the press will be activated to an ON position. When the call for heat is terminated while the heater is inoperative the binary device will be switched to an OFF position thereby providing for an intermittent operation. Cycling between the ON-OFF positions may be visual as, for example, a light which alerts the operator that the molding process is not proceeding properly and remedial steps are required.

The remote binary monitoring device is provided in a coupled relationship with the proximate alert device. When there is a demand for heat and the first proximate device is switched to the ON position due to a defective zone heater, the second remote switch will be permanently switched to the ON position. This switch too may be visual and it will remain activated until the operator manually resets the switch. The remote alert is designed to provide an alert signal when the maintenance operator is at a distant location with respect to the press. The system is designed to provide as many remote alerts as may be needed to conduct an economically feasible operation.

DESCRIPTION OF THE PREFERRED EMBODIMENTS

Referring now to the drawing in detail, there is depicted a schematic of the monitoring system for device underloading in electrical circuits. The circuit consists essentially of a temperature controller 10 and a control circuit 20 which are interconnected to monitor loads 14, 16 and which are in the form of electrical heater devices to be discussed hereinafter. The temperature controller 10 includes a relay coil HR and associated relay contacts HR-1 (indicated by the dotted line) which are in an open mode when the coil HR is in an unenergized state. The controller 10 further includes a thermocouple 12, which is connected inseries to the relay coil HR across a 110 volt electrical supply source, to measure and control temperature in known industrial process equipment. To this end, the thermocouple 12 is formed by a combination of two dissimilar metals having a junction that can be maintained at a temperature which it is desired to measure. Thus, when it is desired to maintain a certain temperature above an ambient temperature the thermocouple 12 is manually adjusted to a required pre-set value and the electrical heater loads 14, 16 are provided to supply heat to various zones or areas in the process equipment by energization from a 220 volt AC electrical source. When the pre-set temperature is reached the thermocouple 12 prevents the heater loads 14, 16 from supplying more heat.

A current sensing coil 18 is provided for each zone as a means for determining whether a current I1 to the loads 14, 16 are nominally valued or undervalued. The current sensing 18 includes a current sensing reading unit 18a for determining whether there is an underloading or underamperage drawn by the loads 14, 16. The current sensing coil 18 and current sensing reading unit 18a includes, as indicated by dotted lines, contacts B and D which are closed when no current flows to the loads 14, 16. The sensing coil 18 and reading unit 18a are commercially available items which are manufactured by Gould, Inc., General Electric Company, Allan Bradley and RK Electronics. The control circuit 20 further includes a relay CR1 which is energized by current I1 from the 220 volt supply when contacts HR-1 are closed. The relay coil CR1 includes a pair of relay contacts A and C as indicated by dotted lines and these remain open when their associated relay is unenergized. The relay contacts A and B are connected with an alarm alert 22 to form an in-series electrical connection. The alert 22 may be in the form of a light, bell or other electrical device located in proximity to industrial machinery (not shown) where the zone heaters 14, 16 are positioned. In like manner, the contacts C and D are electrically connected to one another and to a time delay 24 to form a second-in-series connection. The second-in-series connection is connected to a parallel circuit consisting of a relay coil 26 and alarm alert 30.

The alert 30 is similar in nature to the proximate alert 22, but it is located remotely with respect to the location of the heater loads 14, 16 and the process equipment which is being monitored. The relay coil 26 includes contacts E as indicated by a dotted line and these are joined to a manual re-set button 32 to provide a third-in-series electrical connection. The in-series connection provided by the re-set button 32 and relay contacts E is also connected to the parallel circuit provided by relay coil 26 and remote alert 30.

The instant invention finds particular application in monitoring underloading or under amperage in electrical heater circuits employed in the plastics molding industry as, for example, in plastic molding presses of compression/transfer or injection types. Presses of these types employ cartridge or band heaters positioned within platens, which support the molds, for either curing or plasticizing thermoresins during a formation process. Two molds are utilized during the formation process which are brought together by action of the press to form a plastic product. Heat is supplied to the zones or areas of the mold, that is, the upper or lower mold or the left and right side thereof. Cartridge type heaters are employed with the compression/transfer press utilizing thermoset plastics which must reach high temperatures on an order of 360°–400° F. This temperature must be reached at the termination of the molding process whereby the plasticized material may be properly cured or set-up. On the other hand, band heaters used with injection barrel so as to cause plastic pellets to plasticize or become molten at the beginning of the molding process. Most transfer/compression presses have a two zone heat circuit with three to sixteen heaters per zone; and injection molding presses have a four zone heat with several band heaters in each zone. The present invention monitors heaters located in various zones of the mold in the injection press device at the beginning of the process and also in the compression/transfer press device upon termination of the product cycle. It is the purpose of the instant monitoring system to prevent cartridge or band damage and eliminate extended down-time when such damage occurs. This is achieved by providing a warning to a mold operator when there is a sudden electrical heater malfunction or failure as indicated by underloading. It should be understood that if a heater load malfunction can be discovered and expeditiously repaired by operating personnel it will not be necessary to remove the molten or set-up plastic from the mold and excessive press down-time will be obviated. The monitoring system of this invention has particular application in plastic molding but it is also applicable to any system where electrical heaters and temperature controllers are utilized. Typical of such other applications is the electrical hot water system used in private homes or industry.

A typical application of the present monitoring system will now be described in detail when called upon to energize or supply current to the zoned electrical heater loads 14, 16 as the result of a demand for heat from the temperature controller 10. Only two heater loads 14, 16 per zone are shown in the drawing but in practice there may be as many as sixteen heaters per zone. The call for heat is initiated by manually adjusting the thermocouple 12 to a required temperature, e.g., 325° F., thereby causing the heat relay HR to be energized by the 110 volt source and sequentially causing contacts HR-1 to close from its normally open position. The closing of contacts HR-1 allows control relay CR1 to become energized by current I1 from the 220 volt source and contacts A and C thereby close from their normally open state. The ciosing of relay contacts HR-1 also cause a current I2 to energize the zone heater loads 14, 16 through the current sensing coil 18. As understood, the energizing of the heater loads 14, 16 of the band or cartridge heater types, as the case may be, enables the pre-set temperature as designated by the controller 10 to be reached. The current sensing coil 18 includes a potentiometer (not shown) which allows a 0–50 ampere adjustment to accommodate the number of loads.

The current sensing read unit 18a, which is integral with the sensing coil 18, is also energized by a current I3 from the 220 volt source. As long as the current I2 to the heater loads 14,16 is nominal the contacts B and D are open from their normally closed position while contacts A and C are closed. Accordingly, a current I4 cannot flow in the first-in-series connection to energize the panel light 22 thereby indicating to operating personnel that the heater loads 14, 16 are functioning properly. In like manner, when the current I2 is nominal to the heater load 14, 16 a current I6 cannot flow from the 220 volt source via a current I5 to energize the remote light 30 through closed contacts C since contacts D in the second-in-series connection are also open. It should also be noted that a current I8 may not flow to the remote light 30 through the third-in-series connection since relay contacts E remain open when relay coil 26 is unenergized.

When the current I2 becomes undervalued or below nominal, as detected by the current sensing coil 18 and reading unit 18a, it is an indication that the electrical load 14,16 of a designated zone is malfunctioning and requires immediate attention by operating personnel. As long as there is a call for heat, as indicated by the closing of contacts HR-1 and the energizing of relay CR1 by the current I1 from the 220 volt AC source, the relay contacts A and C will be closed; however, the current sensing coil 18 will detect the underloading and the current I3 will cause the current reading unit 18a to keep contacts B and D closed with respect to their normally closed position. The closing of relay contacts A and B due to the call for heat allows the current I4 to flow in the first-in-series connection to energize the proximately positioned light 22. In like manner, the call for heat in combination with underloading causes the current I5 to flow in the second-in-series connection. The current I5 through the second-in-series connection divides into two currents I6, I7 which respectively energizes the relay coil 26 and remote light 30. Accordingly, the monitoring system of the invention causes the respective alarm lights 22, 30 to become energized thereby warning of a malfunction in one or both of heater loads 14, 16 in proximity to the press (not shown) or at a remote location therefrom. The energizing of relay coil 26 by means of current I6 causes contacts E to close and the current I8 to flow in the third-in-series connection whose significance will be discussed below. As soon as maintenance personnel are alerted that there is a heater load malfunction they refer to the zone in question and by use of a pyrometer or ammeter are able to ferret out which of the loads 14, 16 is defective.

In the present invention the remote light 30 remains energized even though there no longer may be a call for heat by the temperature controller 10. Under this circumstance the proximate light 22 will no longer be energized by the current I6 through the current I5 since the contacts A revert to an open state in the second-inseries connection. However, the remote light 30 remains energized when there is no longer a call for heat through use of a latching circuit comprising relay contacts E and re-set button 32 forming the third-in-series connection, which provides a path for the current I8. In other words, the current I8 now provides a main current for providing branch currents I6, I7 to respectively keep coil 26 and remote light 30 energized. In effect, the main current I8 through the third-in-series connection substitutes for the main current I5 which formerly flowed in the second-in-series connection provided by contacts C and D, and time delay 24. The current I8 may be terminated and light 30 extinguished by manually opening the re-set button 30 and this function is normally accomplished by operating personnel after they have been alerted to the heater malfunction.

The control circuitry 20 provides a time delay 24 in the second-in-series connection which includes contacts C and D. The delay 24 is utilized to prevent flicker in the remote light 30 when there is an initial call for heat and there is no malfunction in heaters 14, 16. In the event that flicker was not eliminated in remote light 30 it would remain energized because of the functioning of the latching circuit. The delay 24 provides a time delay of approximately ½ second to overcome a time lag of the currents I2, I3 reaching full value in the current sensing and reading units 18, 18a. Thus, were it not for the time delay 24 the current I5 would momentarily flow through the closed contacts C and the normally closed contacts D since the latter remains closed until the current I2 reaches full value in the loads 14, 16. The ½ second delay prevents the branch current I7, which emanates from the main current I5, from momentarily energizing remote light 30 because the contacts D will open within this time period. In effect, therefore, this circuitry ignores the time taken for the currents I2, I3 to rise to full amperage and prevents a false indication that there is underloading in the heater loads 14, 16. On the other hand, flicker occurs in the proximate light 22 every time that there is a call for heat. This flicker however is short-lived since the light 22 is extinguished when the call for heat is removed. Maintenance personnel can interpret and utilize this flicker signal to indicate that the heater loads 14, 16 are functioning properly.

The various open-closed states of the relay contacts A, B, C, D and E as well as the ON-OFF state of proximate and remote lights 22, 30 when there is a call for heat by the temperature controller 10 are summarized below for ease of understanding.

|  | CONTROL CIRCUIT | | | LATCHING CIRCUIT | | | |
| --- | --- | --- | --- | --- | --- | --- | --- |
|  | A | B | Lights | C | D | E | Lights |
| No Input | Open | Closed | Off | Open | Closed | Open | Off |
| Normal | Closed | Open | Off | Closed | Open | Open | Off |
| Malfunction | Closed | Closed | On | Closed | Closed | Closed | On |

This invention has been described by reference to precise embodiments but it will be appreciated by those skilled in the art that this concept is subject to variation and modification and to the extent that these are within the skill of the artisan to effect, said variations and modifications are included within the scope of the appended claims.

What is claimed is:

1. A method for monitoring current in an apparatus containing an electrical zoned heater load which may be activated to provide a pre-set temperature value, said apparatus including first and second alarm means to warn when the current received by said load is undervalued comprising:
   (a) locating said first alarm means in proximity to said apparatus and said second alarm means at a remote location;
   (b) causing said load to become activated when there is a call to supply heat therefrom;
   (c) simultaneously causing said apparatus to generate first and second signals when the current in said heater load becomes undervalued;
   (d) energizing said first and second alarms by means of said respective first and second signals when the current to said load becomes undervalued and there is a call to supply heat to said load; and
   (e) de-energizing said first alarm when the call for heat is removed, whereby, the energizing and de-energizing of said first alarm provides an alert of a heater malfunction in the vicinity of said apparatus, whereas, said second alarm remains energized when the call for heat is removed and remains as such until manually terminated.

2. The method in accordance with claim 1 including a further step causing said first and second alarms to remain energized when their is a call for heat and the current to said load becomes undervalued thereby indicating that there is a malfunction.

3. An apparatus for monitoring current from a supply source to an electrical heater circuit of a zoned device comprising:
   (a) controller means activating said heater circuit to provide a pre-set temperature range;
   (b) first control means coupled to said heater circuit and including first and second switching means;
   (c) means coupled both to said supply source and heater circuit for interpreting whether the current thereto is nominal or undervalued, said interpreting means including first and second switching means;
   (d) a first alerting means proximately positioned with respect to said heater circuit, said first proximately positioned alerting means and said first switching means of said respective first control and interpreting means being connected to one another to provide a first series connection;
   (e) a second control means, said second control means providing a switching means;
   (f) a second alerting means remotely positioned with respect to said heater circuit, said second switching means of said respective first control and interpreting means being connected to one another to provide a second series connection, and said second series connection being further connected to either said second control means or said second remotely positioned alerting means;
   (g) a reset means, said second control switching means and said reset means being serially connected to one another to provide a third series connection, and said third series connection further being connected to either said second control means or said second remotely positioned alerting means;

(h) whereby when there is a call by said controller to supply heat to said zoned device by activating said electrical heater circuit, and the current in said electrical circuit becomes undervalued to prevent reaching said pre-set temperature range, said first proximately positioned alerting means being energized through said first series connection to warn of a heater circuit malfunction in the vicinity of said circuit, and said second remotely positioned alerting means being similarly activated through said second series connection to warn of the malfunction at a distance from said heater circuit, said first alerting means becoming automatically de-energized when there is no longer a call to supply heat, whereas said second alerting means remaining activated until deactivated manually through said reset means.

4. The apparatus in accordance with claim 3 wherein said controller means comprises a thermocouple means.

5. The apparatus in accordance with claim 4 wherein said first control means further comprises a first relay 6. The apparatus in accordance with claim 5 wherein said first proximately portioned alerting means comprises a light means.

7. The apparatus in accordance with claim 6 wherein said second control means comprises a second relay means.

8. The apparatus in accordance with claim 7 wherein said second remotely positioned alerting means comprises a light means.

9. The apparatus in accordance with claim 8 wherein said second control means, said second and third series connection comprise a latching circuit to cause said second remote alerting means to remain activated when there is no longer a call to supply heat to said zone device.

10. The apparatus in accordance with claim 8 wherein said second series connection further includes a time delay means to prevent flicker in said remotely positioned light means.

* * * * *